(12) United States Patent
Onuki et al.

(10) Patent No.: US 11,657,867 B2
(45) Date of Patent: May 23, 2023

(54) SEMICONDUCTOR DEVICE, MEMORY DEVICE, AND ELECTRONIC DEVICE

(71) Applicant: SEMICONDUCTOR ENERGY LABORATORY CO., LTD., Atsugi (JP)

(72) Inventors: Tatsuya Onuki, Kanagawa (JP); Takanori Matsuzaki, Kanagawa (JP); Kiyoshi Kato, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/377,757

(22) Filed: Jul. 16, 2021

(65) Prior Publication Data

US 2021/0343329 A1 Nov. 4, 2021

Related U.S. Application Data

(63) Continuation of application No. 16/640,206, filed as application No. PCT/IB2018/056412 on Aug. 24, 2018, now Pat. No. 11,074,962.

(30) Foreign Application Priority Data

Sep. 6, 2017 (JP) .............................. JP2017-170814
Feb. 28, 2018 (JP) ................................. 2018-034610

(51) Int. Cl.
*G11C 11/40* (2006.01)
*G11C 11/4091* (2006.01)
(Continued)

(52) U.S. Cl.
CPC ............ *G11C 11/4091* (2013.01); *G11C 5/02* (2013.01); *G11C 5/063* (2013.01); *H01L 27/10805* (2013.01)

(58) Field of Classification Search
None
See application file for complete search history.

(56) References Cited

U.S. PATENT DOCUMENTS 5,561,623 A   10/1996  Ema
8,508,967 B2   8/2013  Yamazaki et al.
(Continued)

FOREIGN PATENT DOCUMENTS

CN   106796918 A    5/2017
JP   2012-256820 A  12/2012
(Continued)

OTHER PUBLICATIONS

International Search Report (Application No. PCT/IB2018/056412) dated Nov. 27, 2018.
(Continued)

*Primary Examiner* — Tan T. Nguyen
(74) *Attorney, Agent, or Firm* — Fish & Richardson P.C.

(57) ABSTRACT

A memory device in which bit line parasitic capacitance is reduced is provided. The memory device includes a sense amplifier electrically connected to a bit line and a memory cell array stacked over the sense amplifier. The memory cell array includes a plurality of memory cells. The plurality of memory cells are each electrically connected to a bit line. A portion for leading the bit lines is not provided in the memory cell array. Thus, the bit line can be shortened and the bit line parasitic capacitance is reduced.

6 Claims, 9 Drawing Sheets

(51) Int. Cl.
  *G11C 5/02*   (2006.01)
  *G11C 5/06*   (2006.01)
  *H01L 27/108* (2006.01)

(56) References Cited

U.S. PATENT DOCUMENTS

| | | | |
|---|---|---|---|
| 8,809,927 B2 | 8/2014 | Takemura | |
| 9,007,812 B2 | 4/2015 | Koyama et al. | |
| 9,514,792 B2 | 12/2016 | Kajigaya | |
| 9,704,562 B2 | 7/2017 | Onuki et al. | |
| 9,728,243 B2 | 8/2017 | Kato | |
| 9,859,439 B2 | 1/2018 | Miyairi | |
| 9,922,692 B2 | 3/2018 | Koyama | |
| 9,990,965 B2 | 6/2018 | Atsumi | |
| 10,304,523 B2 | 5/2019 | Kato et al. | |
| 10,490,258 B2 | 11/2019 | Onuki et al. | |
| 2010/0208509 A1 | 8/2010 | Maejima | |
| 2012/0063208 A1 | 3/2012 | Koyama et al. | |
| 2013/0070506 A1 | 3/2013 | Kajigaya | |
| 2015/0076495 A1 | 3/2015 | Miyairi | |
| 2015/0262642 A1 | 9/2015 | Koyama | |
| 2015/0294710 A1 | 10/2015 | Onuki | |
| 2015/0325282 A1 | 11/2015 | Kato et al. | |
| 2016/0104521 A1 | 4/2016 | Onuki et al. | |
| 2016/0172010 A1 | 6/2016 | Kato | |
| 2016/0172021 A1 | 6/2016 | Ishizu | |
| 2016/0293232 A1 | 10/2016 | Ishizu et al. | |
| 2016/0336055 A1 | 11/2016 | Kato | |
| 2016/0336059 A1 | 11/2016 | Matsuzaki | |
| 2020/0389617 A1* | 12/2020 | Totsuka | H04N 5/378 |

FOREIGN PATENT DOCUMENTS

| | | |
|---|---|---|
| JP | 2013-065638 A | 4/2013 |
| JP | 2013-145875 A | 7/2013 |
| JP | 2014-197444 A | 10/2014 |
| JP | 2015-084411 A | 4/2015 |
| JP | 2015-187905 A | 10/2015 |
| JP | 2015-228492 A | 12/2015 |
| JP | 2016-212944 A | 12/2016 |
| JP | 2016-213487 A | 12/2016 |
| JP | 2017-028237 A | 2/2017 |
| JP | 2017-120833 A | 7/2017 |
| WO | WO-2015/170220 | 11/2015 |
| WO | WO-2016/055903 | 4/2016 |

OTHER PUBLICATIONS

Written Opinion (Application No. PCT/IB2018/056412) dated Nov. 27, 2018.

Chinese Office Action (Application No. 201880058030.4) dated Mar. 27, 2023.

* cited by examiner

SEMICONDUCTOR DEVICE, MEMORY DEVICE, AND ELECTRONIC DEVICE

CROSS REFERENCE TO RELATED APPLICATIONS

This application is a continuation of U.S. application Ser. No. 16/640,206, filed Feb. 19, 2020, now allowed, which is incorporated by reference and is a U.S. National Phase Application under 35 U.S.C. § 371 of International Application PCT/IB2018/056412, filed on Aug. 24, 2018, which is incorporated by reference and which claims the benefit of foreign priority applications filed in Japan on Sep. 6, 2017, as Application No. 2017-170814 and on Feb. 28, 2018, as Application No. 2018-034610.

TECHNICAL FIELD

One embodiment of the present invention relates to a memory device and a semiconductor device including the memory device. Note that one embodiment of the present invention is not limited to the above technical field.

Note that a semiconductor device in this specification means any device that can operate by utilizing semiconductor characteristics. A circuit including a semiconductor element (e.g., a transistor or a diode), a device including the circuit, and the like are included in the category of a semiconductor device. For example, an electronic circuit and a chip including an electronic circuit are examples of a semiconductor device. A memory device, a display device, a light-emitting device, a lighting device, an electro-optical device, an electronic device, and the like are examples of a semiconductor device.

BACKGROUND ART

A DRAM (Dynamic Random Access Memory) stores data by accumulation of electric charge in a capacitor. Thus, a smaller off-state current of a write transistor for controlling the supply of electric charge to the capacitor is preferable, because the smaller off-state current ensures a longer retention period and enables a lower frequency of refresh operation.

A transistor including a metal oxide semiconductor (preferably an oxide semiconductor containing In, Ga, and Zn) in its semiconductor layer is known as a kind of transistor. It is known that a transistor including a metal oxide in its semiconductor layer has an extremely low off-state current. Note that in this specification, a transistor including a metal oxide in its semiconductor layer is referred to as an oxide semiconductor transistor, a metal oxide transistor, an OS transistor, or the like in some cases.

With an OS transistor, a memory device with excellent retention characteristics can be provided. Note that a memory device including an OS transistor in its memory cell is referred to as an oxide semiconductor memory device, a metal oxide memory device, or the like in some cases. For example, Patent Document 1 describes that stacking a peripheral circuit and a memory cell array can reduce the size of a metal oxide memory circuit.

REFERENCES

Patent Document

[Patent Document 1] Japanese Published Patent Application No. 2012-256820

SUMMARY OF THE INVENTION

Problems to be Solved by the Invention

Achievement of higher performance and lower power consumption of a computing system requires a further reduction in power consumption, an increase in operating speed, downsizing, an increase in memory capacity, and the like, in a memory device such as a DRAM.

Objects of one embodiment of the present invention are a reduction in power consumption, an increase in operating speed, downsizing, an increase in memory capacity, or simplification of a manufacturing process, of a semiconductor device.

Note that the descriptions of these objects do not disturb the existence of other objects. There is no need to achieve all these objects in one embodiment of the present invention. Other objects will be apparent from and can be derived from the descriptions of the specification, the drawings, the claims, and the like.

Means for Solving the Problems (1) One embodiment of the present invention is a semiconductor device including a first circuit provided with a first wiring and a first transistor, and a second circuit provided with a second transistor. The second circuit is stacked over the first circuit, the first transistor and the second transistor are electrically connected to the first wiring, and the second circuit is not provided with a leading portion for the first wiring.

(2) One embodiment of the present invention is a semiconductor device including a first circuit and a second circuit. The first circuit includes a first transistor and a first wiring electrically connected to the first transistor. The second circuit includes a conductor and a second transistor electrically connected to the first wiring through the conductor. The conductor has a portion in contact with a bottom surface of a semiconductor layer of the second transistor.

(3) In the above embodiment (1) or (2), a semiconductor layer of the second transistor includes a metal oxide.

In this specification and the like, ordinal numbers such as "first", "second", and "third" may be used to show the order. Alternatively, ordinal numbers may be used to avoid confusion among components. In these cases, the ordinal numbers do not limit the number of the components. For example, it is possible to replace the term "first" with the term "second" or "third" in describing one embodiment of the present invention.

In the case where there is a description "X and Y are connected" in this specification and the like, the case where X and Y are electrically connected, X and Y are functionally connected, and X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

A transistor includes three terminals called a gate, a source, and a drain. The gate functions as a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms of source and drain are interchangeably used in this specification and the like. In addition, in this specification and the like, the two input/output terminals other than the gate may be referred to as a first terminal and a second terminal in some cases.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

A voltage refers to a potential difference between a given potential and a reference potential (e.g., a ground potential (GND) or a source potential) in many cases. Thus, the term "voltage" can be replaced with "potential." Note that a potential is relative. Thus, the expression "GND" does not necessarily mean 0 V.

In this specification, terms for describing arrangement, such as "over" and "under" are used for convenience to describe the positional relation between components with reference to drawings in some cases. The positional relation between components is changed as appropriate in accordance with a direction in which components are described. Thus, terms for the description are not limited to those used in this specification, and the description can be changed appropriately depending on the situation.

Note that in this specification and the like, the terms such as "film" and "layer" can be interchanged with each other depending on the case or circumstances. For example, the term "conductive layer" can be changed to the term "conductive film" in some cases. For example, the term "insulating film" can be changed to the term "insulating layer" in some cases.

EFFECT OF THE INVENTION

One embodiment of the present invention enables a reduction in bit line parasitic capacitance, an increase in operating speed, downsizing, an increase in memory capacity, or simplification of a manufacturing process.

Note that the descriptions of the effects do not disturb the existence of other effects. One embodiment of the present invention does not need to have all the effects. Effects other than these will be apparent from and can be derived from the descriptions of the specification, the drawings, the claims, and the like.

BRIEF DESCRIPTION OF THE DRAWINGS

FIG. 10 A cross-sectional view illustrating a structure example of a DOSRAM. Mode for

CARRYING OUT THE INVENTION

Figure 1A:
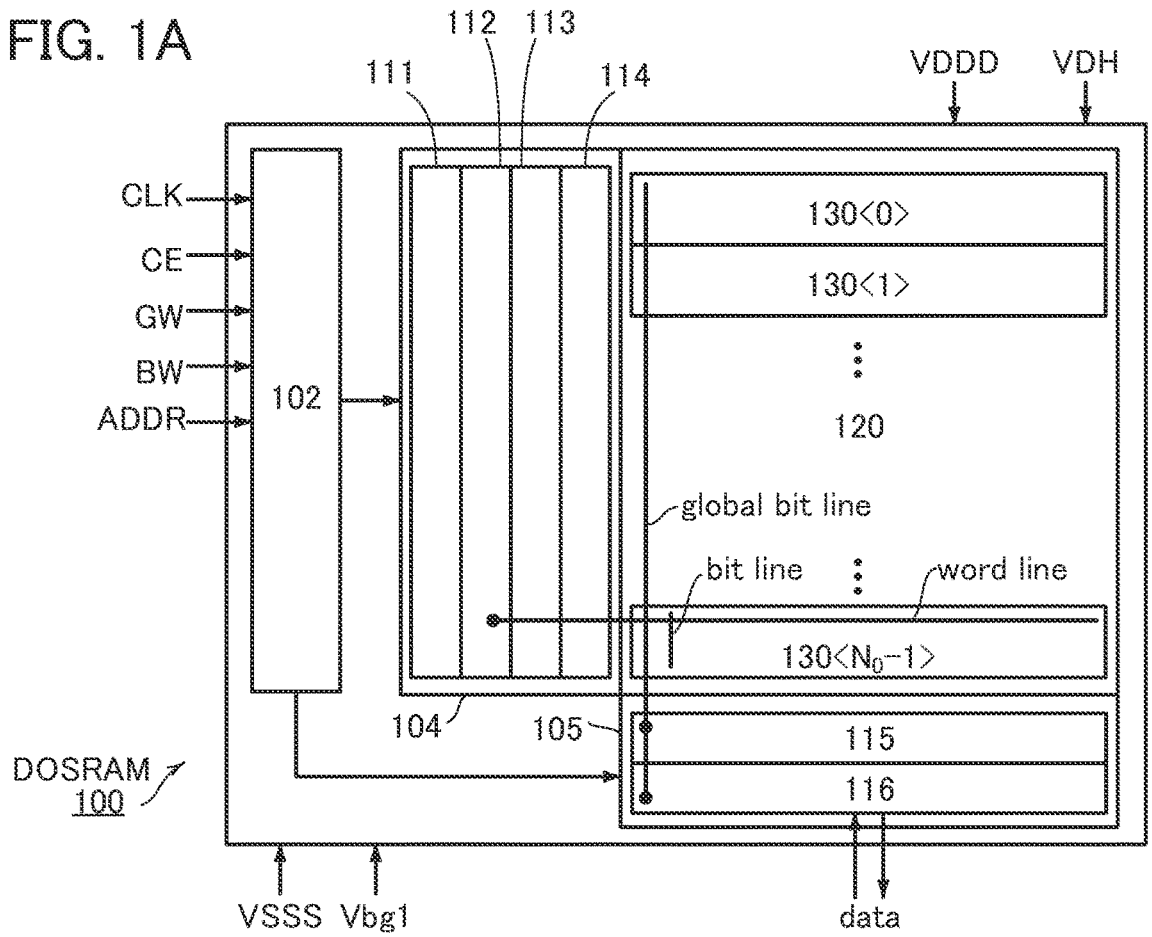
FIG. 1A: a block diagram illustrating a configuration example of a DOSRAM. B: a drawing illustrating a memory cell and a sense amplifier array. C: a circuit diagram illustrating a configuration example of a memory cell.

Embodiments of the present invention are described below. Note that any of the embodiments described in this specification can be combined as appropriate. In the case where a plurality of structure examples (including operation examples, usage examples, manufacturing method examples, and the like) are described in one embodiment, structure examples can be combined with each other as appropriate. Furthermore, the present invention can be implemented in many different modes, and it will be readily appreciated by those skilled in the art that modes and details thereof can be changed in various ways without departing from the spirit and scope thereof Thus, the present invention should not be interpreted as being limited to the following description of the embodiments.

The size, the layer thickness, the region, and the like in the drawings are exaggerated for clarity in some cases. Therefore, they are not limited to the illustrated scale. The drawings schematically show ideal examples, and embodiments of the present invention are not limited to shapes, values, and the like shown in the drawings. For example, variation in signal, voltage, or current due to noise or variation in signal, voltage, or current due to difference in timing can be included.

In this specification, terms for describing arrangement, such as "over" and "under" are used for convenience to describe the positional relation between components with reference to drawings in some cases. The positional relation between components is changed as appropriate in accordance with a direction in which components are described. Thus, terms for the description are not limited to those used in this specification, and the description can be changed appropriately depending on the situation.

The positions of circuit blocks in a block diagram shown in a drawing specifies their positional relations just for description, and the positions of circuit blocks of one embodiment of the present invention are not limited thereto. Even when different circuit blocks are illustrated to achieve individual functions in a block diagram, one circuit block may be actually configured to achieve different functions. Functions of circuit blocks are specified for description, and actual circuit blocks may be provided such that processing performed in one circuit block in an illustration is performed in the plurality of circuit blocks.

Embodiment 1

In this embodiment, a DOSRAM (registered trademark) is described as an example of an oxide semiconductor memory device. Note that "DOSRAM" stands for Dynamic Oxide Semiconductor Random Access Memory. A "DOSRAM" is a memory device whose memory cell is a 1T1C (one-transistor one-capacitor) memory cell and has an OS transistor as a write transistor.

<<Configuration Example of DOSRAM>>

FIG. 1 is a functional block diagram showing a configuration example of a DOSRAM. A DOSRAM 100 in FIG. 1 includes a control circuit 102, a row circuit 104, a column circuit 105, and a memory cell (MC) and sense amplifier (SA) array 120. The row circuit 104 includes a decoder 111, a word line driver 112, a column selector 113, and a sense amplifier driver 114. The column circuit 105 includes a global sense amplifier block 115 and an input/output (I/O) circuit 116.

Voltages VDDD, VDH, VSSS, and Vbg1, a clock signal CLK, an address signal ADDR, and signals CE, GW, and BW are input to the DOSRAM 100. Circuits, signals, and voltages for the DOSRAM 100 can be selected as appropriate. Another circuit or another signal may be added. Structures (e.g., bit length) of input and output signals to/from the DOSRAM 100 are set on the basis of the operation, circuit configuration, and the like of the DOSRAM 100.

The control circuit 102 is a logic circuit having a function of controlling the entire operation of the DOSRAM 100. The control circuit 102 has a function of performing a logical operation on the signals CE, GW, and BW to determine an operation and a function of generating control signals for the row circuit 104 and the column circuit 105 to make the determined operation executed. Note that the signals CE, GW, and BW are a chip enable signal, a global write enable signal, and a bite write enable signal, respectively.

The DOSRAM 100 has a hierarchical bit-line architecture. The MC and SA array 120 includes a plurality of blocks 130 and a plurality of global bit lines. The block 130 includes a plurality of memory cells, a plurality of bit lines, and a plurality of word lines. Here, the number of blocks 130 is $N_O$ ($N_O$ is an integer of 1 or greater). Note that when one of the blocks 130 needs to be specified, a reference numeral 130<0>or the like is used; the reference numeral 130 denotes an arbitrary cell block. The same can be applied to other components, and a reference numeral such as <1>is used to distinguish a plurality of components.

Figure 1B:
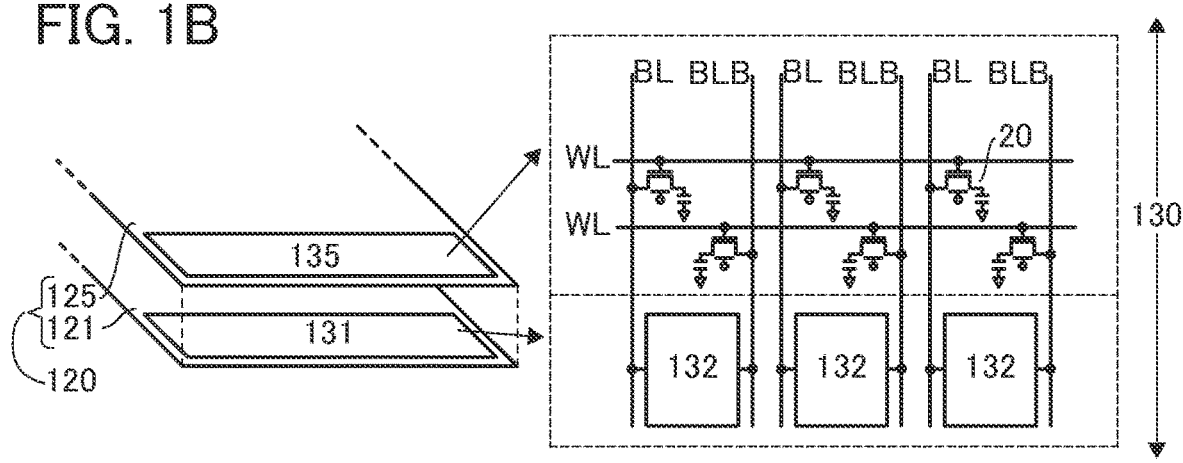

The configurations of the MC and SA array 120 and the block 130 are described with reference to FIG. 1B. The MC and SA array 120 has a structure in which a memory cell array 125 is stacked over a sense amplifier array 121. The sense amplifier array 121 includes $N_O$ sense amplifier blocks 131, and the memory cell array 125 includes $N_O$ local cell arrays 135.

The block 130 has a structure in which the local cell array 135 is stacked over the sense amplifier block 131.

Figure 1C:
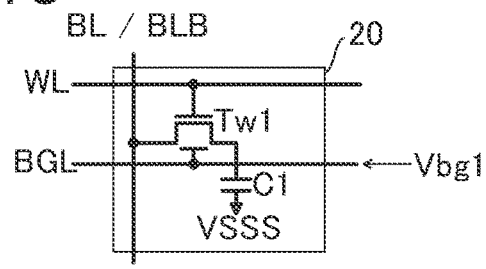

The local cell array 135 includes a plurality of memory cells 20. As illustrated in FIG. 1C, the memory cell 20 includes a transistor Tw1 and a capacitor C1, and is electrically connected to a word line WL, a bit line BL (or BLB), a wiring BGL, and a power supply line for the voltage VSSS. The transistor Tw1 is an OS transistor having a back gate. The back gate is electrically connected to the wiring BGL. The voltage Vbg1 is input to the wiring BGL, for example. The threshold voltage of the transistor Tw1 can be changed with the voltage Vbg1. In the local cell array 135, the word lines WL, the bit lines BL and BLB, and the wirings BGL are provided in accordance with the arrangement of the memory cells 20.

A metal oxide has a band gap of 2.5 eV or wider; thus, an OS transistor has an extremely small off-state current. For example, the off-state current per micrometer in channel width at a source—drain voltage of 3.5 V and room temperature (25° C.) can be lower than $1\times10^{-20}$A, lower than $1\times10^{-22}$A, or lower than $1\times10^{-24}$A. That is, the on/off ratio of drain current can be greater than or equal to 20 digits and less than or equal to 150 digits. Thus, the amount of charge leaking from the retention node through the transistor Tw1 is extremely small in the memory cell 20. Thus, the DOSRAM 100 can be used as a nonvolatile memory device.

A metal oxide used for an OS transistor is a Zn oxide, a Zn—Sn oxide, a Ga—Sn oxide, an In—Ga oxide, an In—Zn oxide, an In—M—Zn oxide (M is Ti, Ga, Y, Zr, La, Ce, Nd, Sn, or Hf), or the like. In addition, an oxide containing indium and zinc may further contain one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

For the purpose of improving the reliability and electrical characteristics of the OS transistor, it is preferable that a metal oxide having a crystal part such as a CAAC-OS, a CAC-OS, an nc-OS, or the like be used for the metal oxide used in the semiconductor layer. CAAC-OS stands for c-axis-aligned crystalline metal oxide semiconductor. CAC-OS stands for Cloud-Aligned Composite metal oxide semiconductor. In addition, nc-OS stands for nanocrystalline metal oxide semiconductor.

The CAAC-OS has c-axis alignment, a plurality of nanocrystals thereof are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of not allowing electrons serving as carriers to flow. The function of allowing electrons to flow and the function of not allowing electrons to flow are separated, whereby both functions can be heightened at the maximum. In other words, when the CAC-OS is used for a channel formation region of an OS transistor, a high on-state current and an extremely low off-state current can be both achieved. Thus, an OS transistor is very suitable for the write transistor of the memory cell.

The sense amplifier block 131 is provided with a plurality of sense amplifiers 132. The sense amplifier 132 has a function of comparing the voltage of the bit line BL and that of the bit line BLB, and a function of amplifying a voltage difference between the bit line BL and the bit line BLB. Note that two bit lines which are compared concurrently by the sense amplifier 132 are referred to as a bit line pair. In the example of FIG. 1B, BL and BLB serve as a bit line pair. In this specification, the bit line pair is referred to as the bit line pair (BL, BLB) in some cases.

Figure 2A:
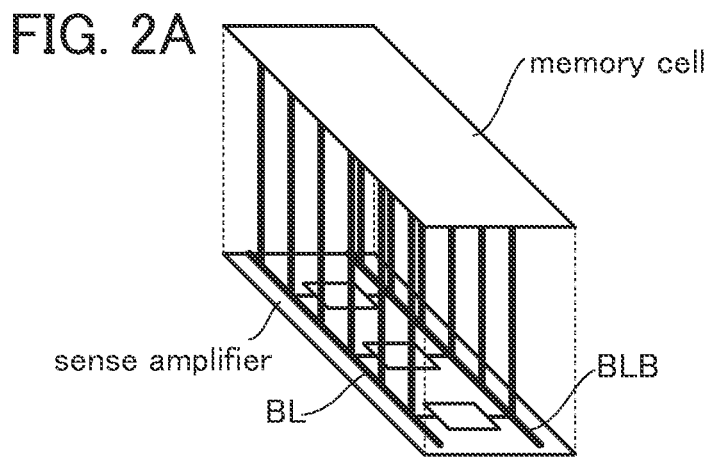
FIG. 2A to D: diagrams illustrating a configuration example of a bit line.
Figure 2B:
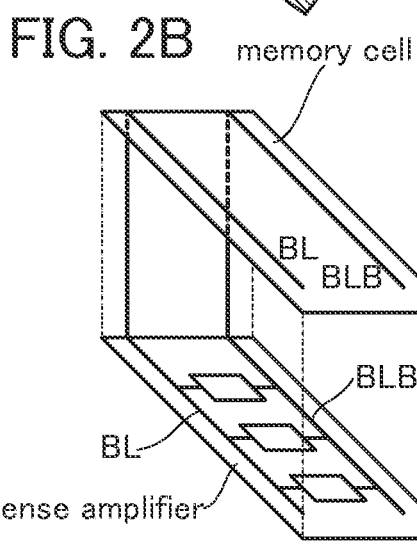

Since the transistor Tw1 is an OS transistor, the local cell array 135 can be stacked over the sense amplifier block 131. With such a stacked structure, the bit line can be shortened. Hereinafter, bit line shortening is described with reference to FIGS. 2A to 2D. FIG. 2A illustrates a configuration example of the bit line according to one embodiment of the present invention, and FIGS. 2B to 2D illustrate comparison examples.

Figure 2C:
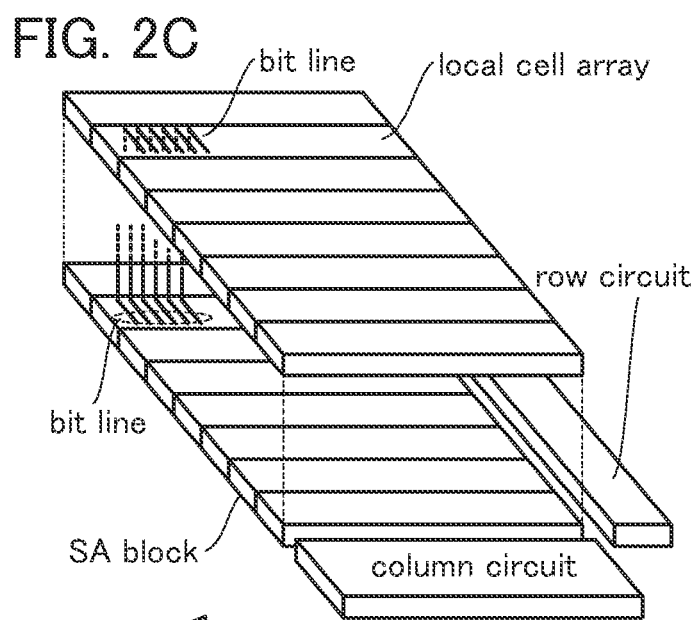
Figure 2D:
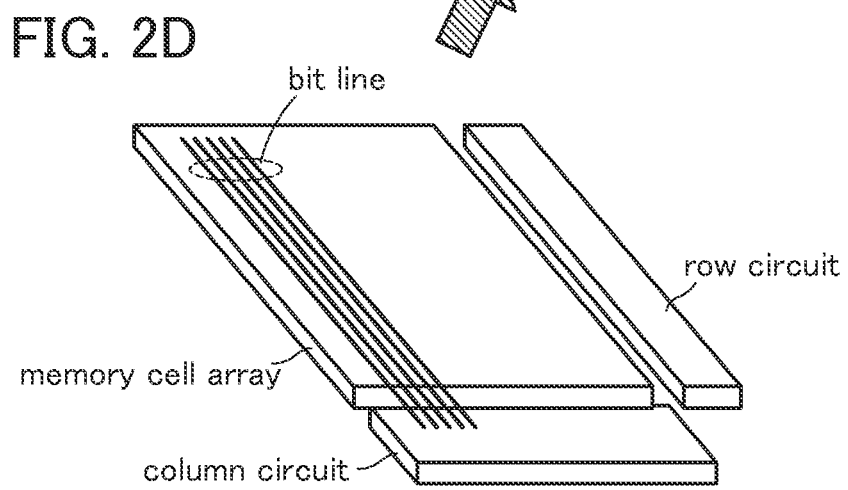

In the comparison example of FIG. 2D, a sense amplifier array and a memory cell array do not have a stacked structure, and the sense amplifier is provided in the column circuit. Thus, in the comparison example of FIG. 2D, a bit line has almost the same length as a memory cell array.

In the comparison example of FIG. 2C, a memory cell array is divided into a plurality of local cell arrays and the local cell arrays are stacked over the sense amplifier block. Thus, the length of the bit line provided in the local cell array can be shortened to a length almost the same as that of the sense amplifier block. In this comparison example, the number of memory cells per bit line (also referred to as CPB) is small. A smaller CPB can shorten the bit line, which reduces the capacitance accompanying to the bit line (also referred to as bit line capacitance).

As in a DRAM including Si transistors, the capacitance Cs of the capacitor C1 in the memory cell 20 is preferably small in light of the operation speed, power consumption, production yield, and the like of the DOSRAM 100. A reduction in the bit line capacitance leads to a reduction in the capacitance Cs of the capacitor. When the capacitance Cs is small, the structure of the capacitor C1 and the manufacturing process thereof can be simplified. Furthermore, the DOSRAM 100 can be downsized or can have an increased memory capacity.

FIG. 2B is an enlarged view of part of the local cell array and the sense amplifier block of FIG. 2C. As illustrated in FIG. 2B, the local cell array is stacked over the sense amplifier block, whereby the bit line pair (BL, BLB) for connecting the sense amplifier and the memory cell is led both in the local cell array and the sense amplifier block. In this embodiment, a structure example for further reducing the bit line capacitance is disclosed. Specifically, as illustrated in FIG. 2A, a bit line is not led in the local cell array. A main conduction portion for the memory cell and the sense amplifier is formed by a conductor provided in a via hole. That is, a bit line in the sense amplifier and a bit line in the local cell array are integrated.

Figure 4:
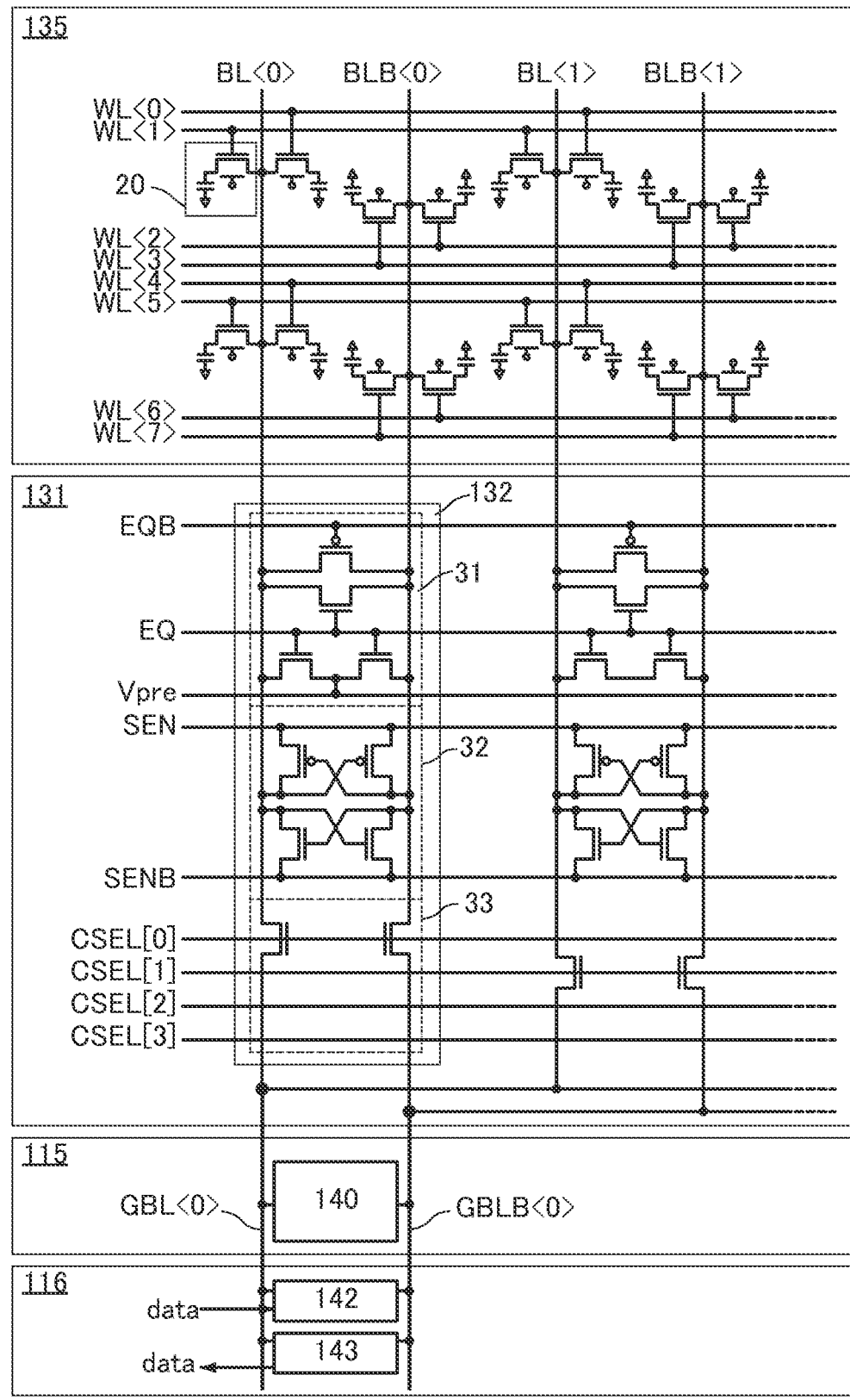
FIG. 4 A circuit diagram illustrating a configuration example of a local cell array and a sense amplifier block.

First, a circuit configuration example of the sense amplifier block 131 and the local cell array 135 is described with reference to FIG. 4. In the example of FIG. 4, the CPB of the local cell array 135 is 8 and two bit line pairs (BL, BLB) are provided with respect to a global bit line pair (GBL, GBLB).

Signals EQ, EQB, SEN, SENB, and CSEL[3:0] and a voltage Vpre are input to the sense amplifier blocks 131. The signals EQB and SENB are inverted signals of the signals EQ and SEN, respectively.

The sense amplifier 132 includes an equalizer 31, a sense amplifier 32, and a selector 33. The signals EQ and EQB are signals for activating the equalizer 31, and the signals SEN and SENB are signals for activating the sense amplifier 32. The signals EQ, EQB, SEN, and SENB are generated by the sense amplifier driver 114. In the case where a local cell array 135<j> is to be accessed (j is an integer of 0 to $N_0-1$), the sense amplifier driver 114 generates the signals EQ, EQB, SEN, and SENB that make the sense amplifier block 131 <j> active and the other sense amplifier blocks 131 inactive. With such control, power consumption of the DOSRAM 100 can be reduced.

The signal CSEL[3:0] is generated by the column selector 113. In response to the signal CSEL[3:0], any one of the four bit line pairs (BL, BLB) is brought into conduction with the global bit line pair (GBL, GBLB).

In the sense amplifier block 115, a global sense amplifier 140 is provided for each global bit line pair (GBL, GBLB). In the input/output circuit 116, a write circuit 142 and a read circuit 143 are provided for each global bit line pair (GBL, GBLB). The write circuit 142 has a function of writing data to the global bit line pair (GBL, GBLB). The read circuit 143 has a function of holding data input to the global bit line pair (GBL, GBLB) and outputting the held data.

Figure 3A:
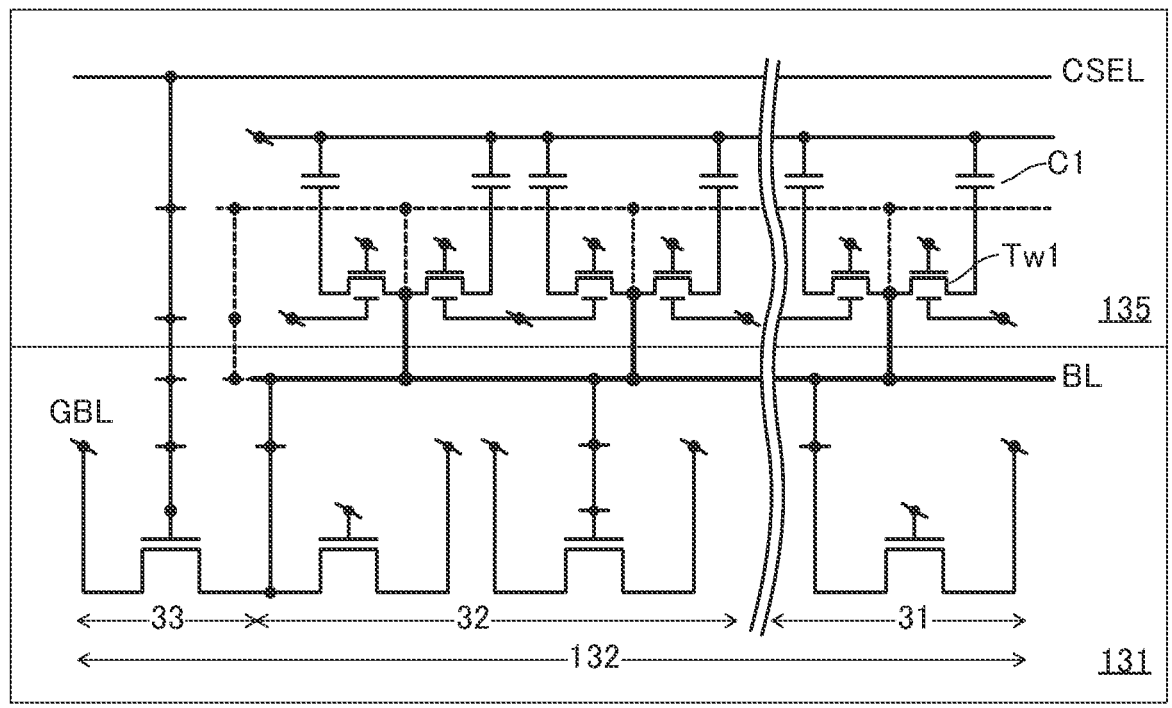
FIG. 3A and B: circuit diagrams illustrating an example in which a local cell array and a sense amplifier block are stacked.
Figure 3A:
Figure 3B:
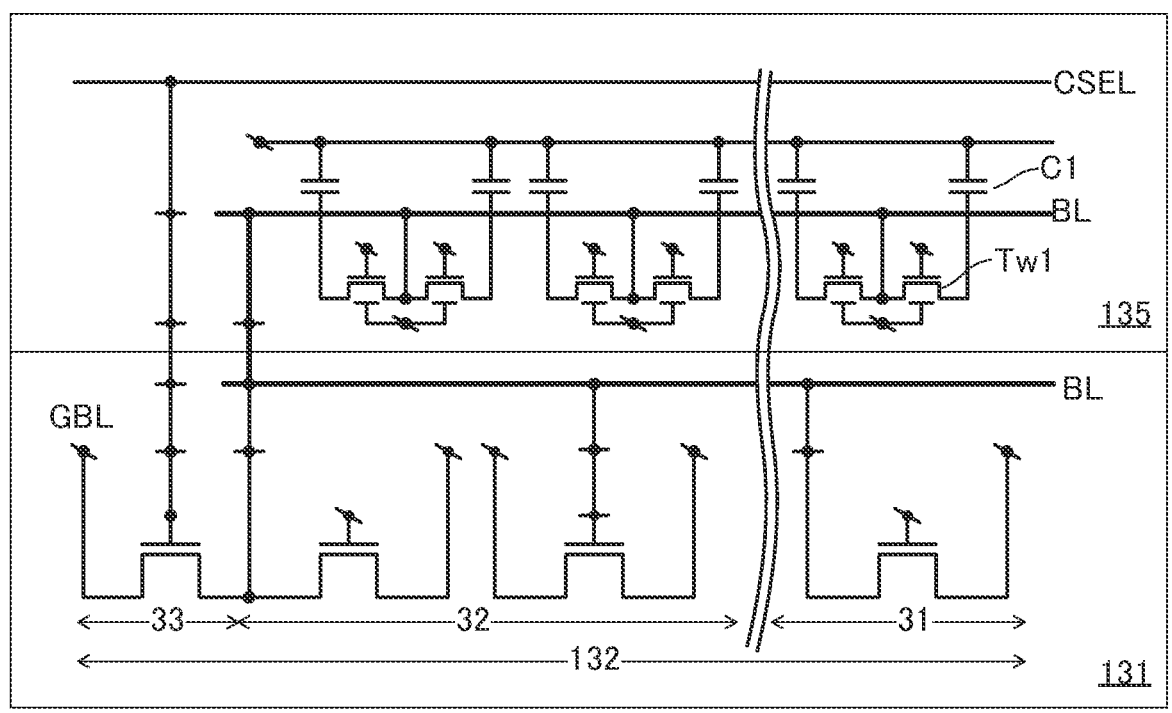

The circuit diagram of FIG. 4 illustrates that the bit line BL is led in the sense amplifier block 131 and the local cell array 135; however, as shown in FIG. 3A, the leading portion for the bit line BL can be provided only in the local cell array 135 when the sense amplifier block 131 and the local cell array 135 are stacked. Note that FIG. 3A corresponds to the circuit diagram of FIG. 2A. FIG. 3B illustrates the circuit diagram of FIG. 2B as a comparison example.

In the comparison example of FIG. 3B, the leading portion for the bit line BL is provided over the transistor Tw1 in the local cell array 135. In contrast, in the configuration example of FIG. 3A, this leading portion is not provided in the local cell array 135. In FIG. 3A, a portion indicated by a dotted line indicates a portion in which the bit line BL is omitted. The length of the bit line BL in FIG. 3A is approximately ½ of that in FIG. 3B. A connection structure example of the bit line BL and the memory cell 20 will be specifically described in Embodiment 3.

The bit line capacitance can be reduced because of the shortened bit line. An index that affects reading performance is the ratio of the bit line capacitance (Cbit) to the capacitance Cs. With a larger Cs/Cbit, a greater potential difference of the bit line pair can be obtained when data is read from the memory cell 20. Therefore, a larger Cs/Cbit enables higher-speed or more stable reading operation. Under the condition where the reading performance is constant, a reduction in the bit line capacitance Cbit enables a reduction in the capacitance Cs of the capacitor C. Therefore, the DOSRAM 100 has excellent reading performance as compared to a conventional DRAM with Si transistors if both of them have the same capacitance Cs of the capacitor C1.

Since the transistor Tw1 is an OS transistor with an extremely low off-state current, the DOSRAM 100 has excellent retention characteristics as compared to a conventional DRAM even when its capacitance Cs is smaller than that of the DRAM. Therefore, the DOSRAM 100 is preferable because it can have the capacitor C1 with smaller capacitance Cs.

Figure 5:
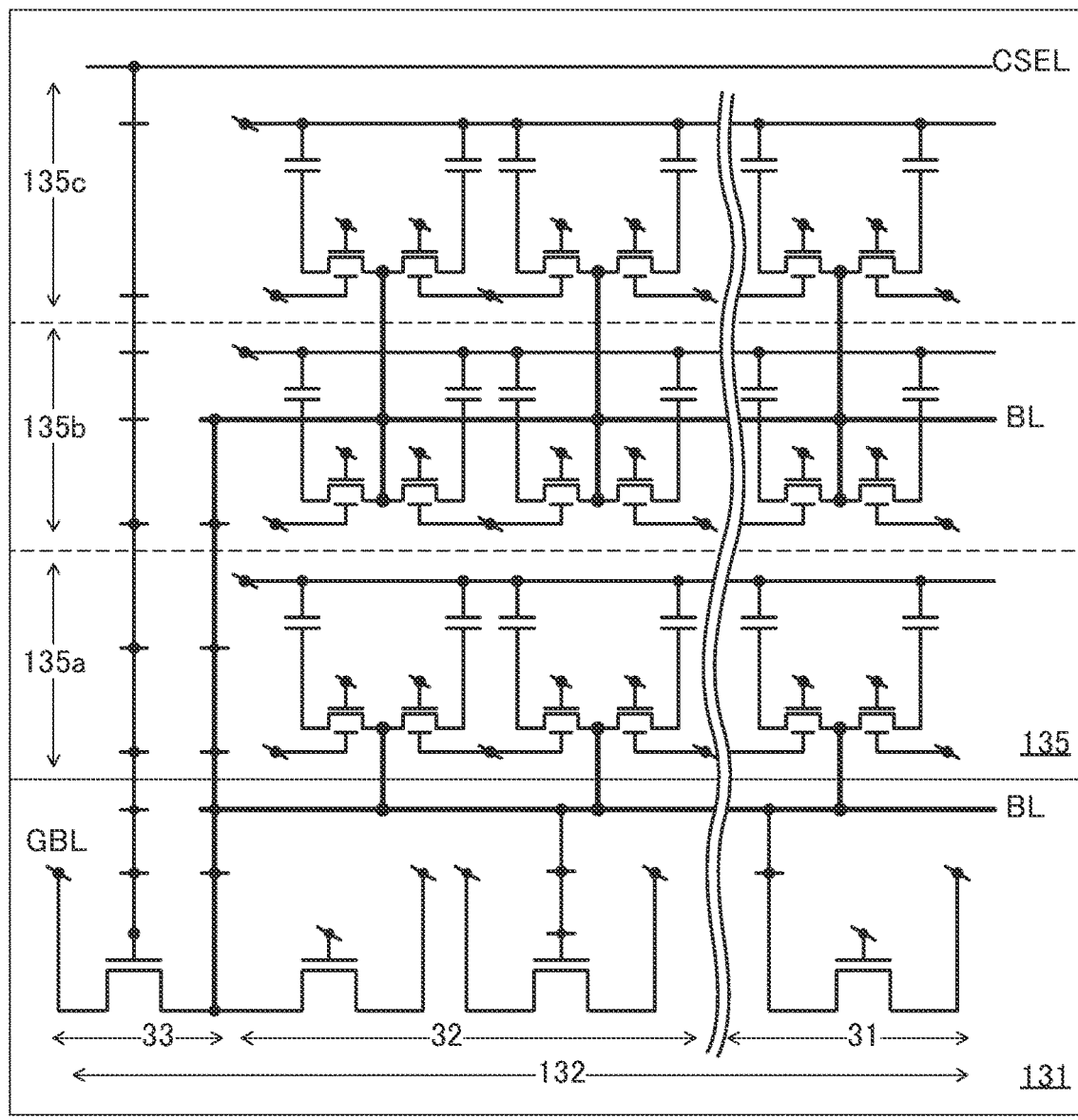
FIG. 5 A circuit diagram illustrating an example in which a local cell array and a sense amplifier block are stacked.

In the DOSRAM 100, the local cell array 135 can have a multilayer structure. FIG. 5 illustrates an example in which the local cell array 135 is formed with three layers of cell arrays 135a to 135c. In this configuration example, a leading portion for the bit line BL is provided in the cell array 135b, and the transistor Tw1 of the cell array 135c is electrically connected to this leading portion.

Although the sense amplifier 132 is formed with a Si transistor in this example, the sense amplifier 132 may be formed with an OS transistor.

Figure 6:
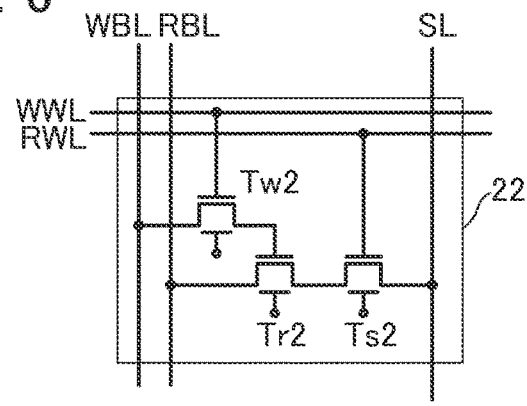
FIG. 6 A circuit diagram illustrating a configuration example of a NOSRAM memory cell.

The structure of the bit line disclosed in this embodiment can be used in other oxide semiconductor memory devices. For example, this structure can be used in a NOSRAM (registered trademark). A NOSRAM stands for Nonvolatile Oxide Semiconductor RAM. The NOSRAM is an oxide semiconductor memory device in which its memory cell is composed of a 2T or 3T gain cell and the transistors in the memory cell are OS transistors. For example, the memory cell 22 illustrated in FIG. 6 includes three transistors Tw2, Tr2, and Ts2. The transistors Tw2, Tr2, and Ts2 are each an OS transistor having a back gate. A capacitor for holding the gate voltage of the transistor Tr2 may be provided in the memory cell 22. The memory cell 22 is electrically connected to a write word line WWL, a read word line RWL, a write bit line WBL, a read bit line RBL, and a source line SL. The write bit line WBL and the read bit line RBL are electrically connected to a sense amplifier. For one or both of the write bit line WBL and the read bit line RBL, the structure of the bit line of this embodiment can be used.

The bit line structure disclosed in this embodiment can be used in a semiconductor device composed of stacked transistors. Shortening the length of the wiring reduces the parasitic capacitance of the wiring, leading to improvement in the performance of the semiconductor device.

Embodiment 2

In this embodiment, an electronic component, an electronic device, and the like including the above-mentioned oxide semiconductor memory device are described.

The above-mentioned oxide semiconductor memory device can be incorporated into a variety of processor chips such as a CPU chip, a GPU chip, an FPGA chip, or an application processor (AP) chip. Here, a configuration example of an AP chip is shown as an example.

Figure 7:
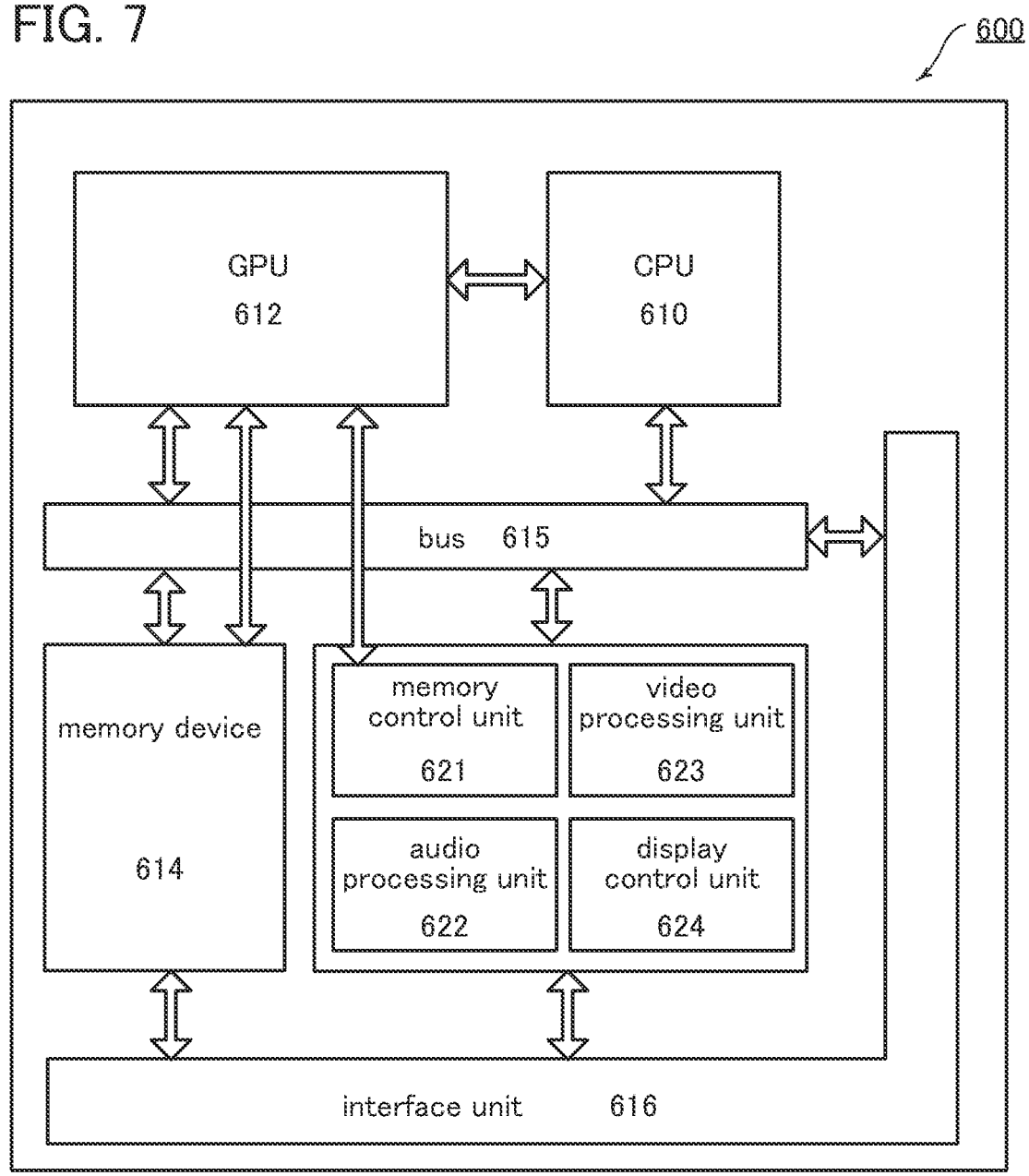
FIG. 7 A block diagram illustrating a configuration example of an application processor (AP) chip.

An AP chip 600 illustrated in FIG. 7 includes a CPU (central processing unit) 610, a GPU (graphics processing unit) 612, a memory device 614, a bus 615, an interface unit 616, a memory control unit 621, an audio processing unit 622, a video processing unit 623, and a display control unit 624. These integrated circuits are provided in one die. Note that circuits provided in the AP chip 600 are selected as appropriate in accordance with the intended use and the like. The above-mentioned oxide semiconductor memory device is used as the memory device 614.

Various kinds of peripheral devices can be controlled with the AP chip 600 in which a variety of functional circuits are provided. For example, the memory control unit 621 includes a memory controller, a DRAM controller, and a flash memory controller. The audio processing unit 622 processes audio data and the like. The video processing unit 623 includes a video decoder, a video encoder, an image processing circuit for a camera, and the like. A display controller and a multi-monitor controller are provided in the display control unit 624.

Figure 8:
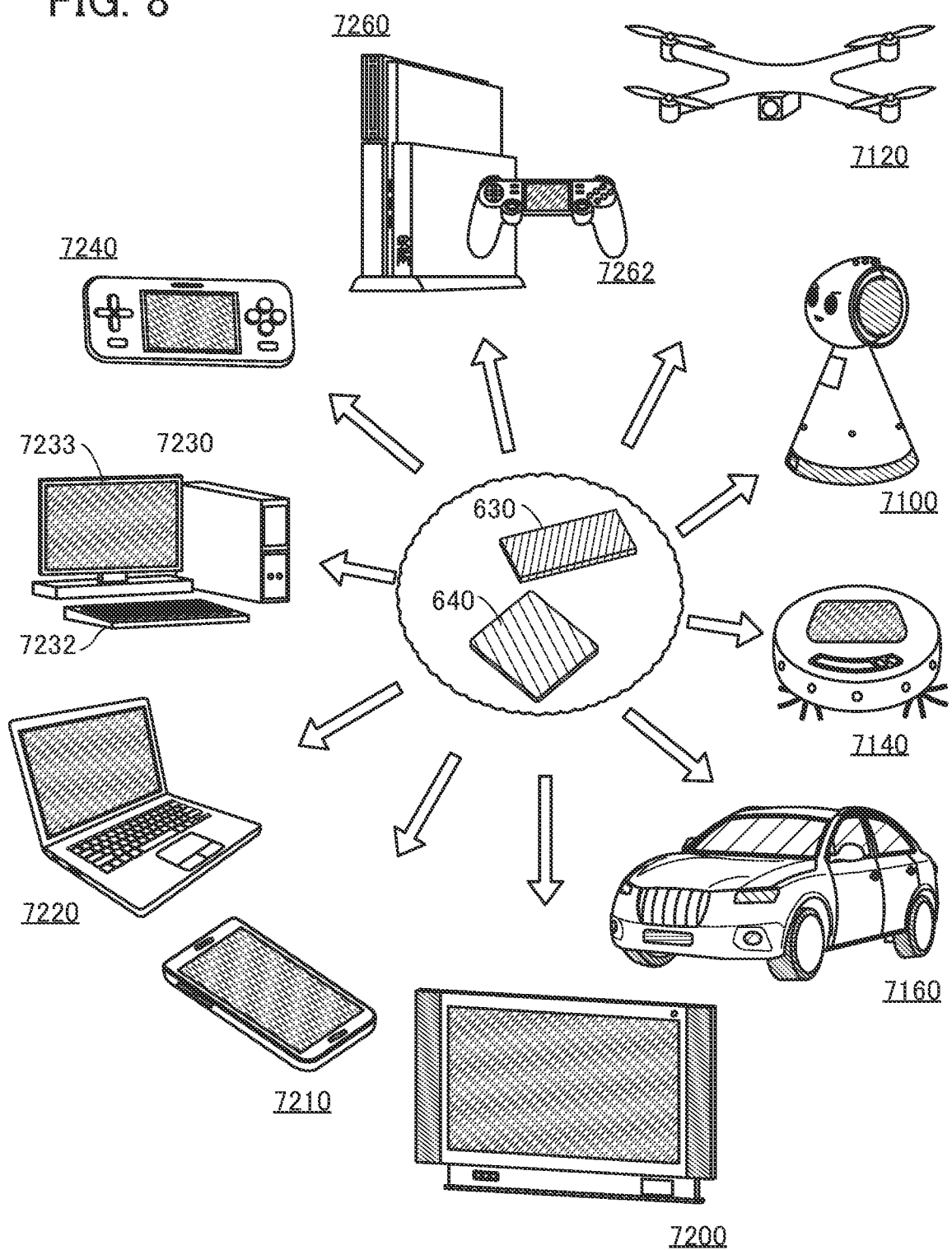
FIG. 8 A diagram illustrating examples of electronic devices.

A memory chip 630 including the above-mentioned oxide semiconductor memory device and a processor chip 640 including the above-mentioned oxide semiconductor memory device can be incorporated in a variety of electronic devices. For example, in the electronic device, the memory chip 630 can be used as a replacement for a DRAM chip or a flash memory chip. FIG. 8 illustrates some examples of electronic devices in each of which the memory chip 630 and/or the processor chip 640 are incorporated.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The processor chip 640 controls these peripheral devices. The memory chip 630 stores data obtained by the sensors, for example.

A microphone has a function of detecting acoustic signals of a speaking voice of a user, an environmental sound, and the like. A speaker has a function of outputting audio signals such as a voice and a warning beep. The robot 7100 can analyze an audio signal input via the microphone and can output a necessary audio signal from the speaker. The robot 7100 can communicate with a user with the use of the microphone and the speaker.

A camera has a function of taking images of the surroundings of the robot 7100. Furthermore, the robot 7100 has a function of moving with the use of a moving mechanism. The robot 7100 can take images of the surroundings with the use of the camera, and can analyze the images to sense whether there is an obstacle in the way of the movement.

A flying object 7120 includes propellers, a camera, a battery, and the like and has a function of flying autonomously. The processor chip 640 controls these peripheral devices.

For example, image data taken by the camera is stored in the memory chip 630. The processor chip 640 can analyze image data to sense whether there is an obstacle in the way of the movement. Remaining battery power can be estimated with the processor chip 640 on the basis of the amount of change in the power storage capacity of the battery.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface.

For example, the processor chip 640 can judge whether there is an obstacle such as a wall, furniture, or a step by analyzing an image taken by the cameras. In the case where an object that is likely to be caught in the brush such as a wiring is detected by image analysis, the rotation of the brush can be stopped.

An automobile 7160 includes an engine, tires, a brake, a steering gear, a camera, and the like. For example, the processor chip 640 performs control for optimizing the running state of the automobile 7160 on the basis of navigation information, the speed, the state of the engine, the gearshift state, the use frequency of the brake, and other data. For example, image data taken by the camera is stored in the memory chip 630.

The memory chip 630 and/or the processor chip 640 can be incorporated in a TV (television receiving) device 7200, a smartphone 7210, PCs (personal computers) 7220 and 7230, game consoles 7240 and 7260, and the like.

For example, the processor chip 640 incorporated in the TV device 7200 can function as an image processing engine. The processor chip 640 performs, for example, image processing such as noise removal and resolution up-conversion.

The smartphone 7210 is an example of a portable information terminal. The smartphone 7210 includes a microphone, a camera, a speaker, various kinds of sensors, and a display unit. The processor chip 640 controls these peripheral devices.

The PCs 7220 and 7230 are respectively examples of a notebook PC and a desktop PC. To the PC 7230, a keyboard 7232 and a monitor device 7233 can be connected with or without a wire. The game console 7240 is an example of a portable game console. The game console 7260 is an example of a stationary game console. To the game console 7260, a controller 7262 is connected with or without a wire. The memory chip 630 and/or the processor chip 640 can be incorporated into the controller 7262.

Embodiment 3

Figure 9:
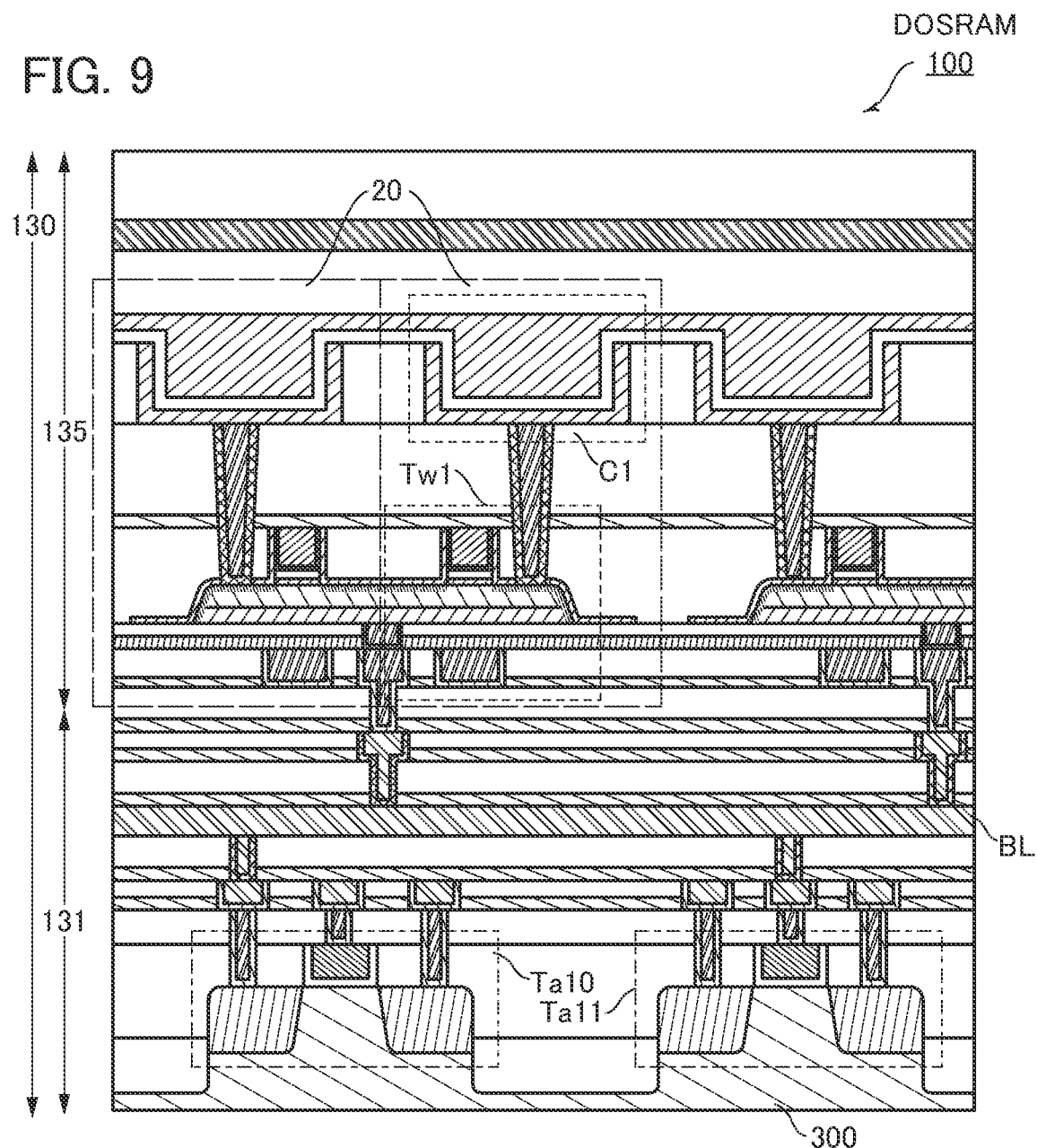
FIG. 9 A cross-sectional view illustrating a structure example of a DOSRAM.

In this embodiment, an example of a stacked structure of the DOSRAM 100 will be described. FIG. 9 illustrates a cross section of the typical block 130. As described above, the local cell array 135 is stacked over the sense amplifier block 131 in the block 130. Note that FIG. 9 corresponds to the cross-sectional view of the circuit diagram in FIG. 3A.

As illustrated in FIG. 9, the bit line BL and Si transistors Ta10 and Ta11 are provided in the sense amplifier block 131. The Si transistors Ta10 and Ta11 have a semiconductor layer in a single crystal silicon wafer. The Si transistors Ta10 and Ta11 constitute the sense amplifier 132 and are electrically connected to the bit line BL.

In the local cell array 135, the two transistors Tw1 share a semiconductor layer. A plurality of conductors are stacked between the semiconductor layer and the bit line BL. Through these conductors, the transistor Tw1 has electrical continuity with the bit line BL. With such a connection structure, the sense amplifier block 131 and the local cell array 135 can share the bit line BL in the local cell array 135.

Accordingly, the length of the bit line BL is shortened and the bit line BL does not have a portion intersecting with the word line WL, so that the bit line parasitic capacitance Cbit can be reduced. Accordingly, the memory cell 20 can be formed with the capacitor C1 with small capacitance Cs. For example, the capacitor C1 may have a structure illustrated in FIG. 10. The area of the capacitor C1 is reduced, whereby the area of the memory cell 20 can be reduced and the DOSRAM 100 can be downsized.

Figure 10:
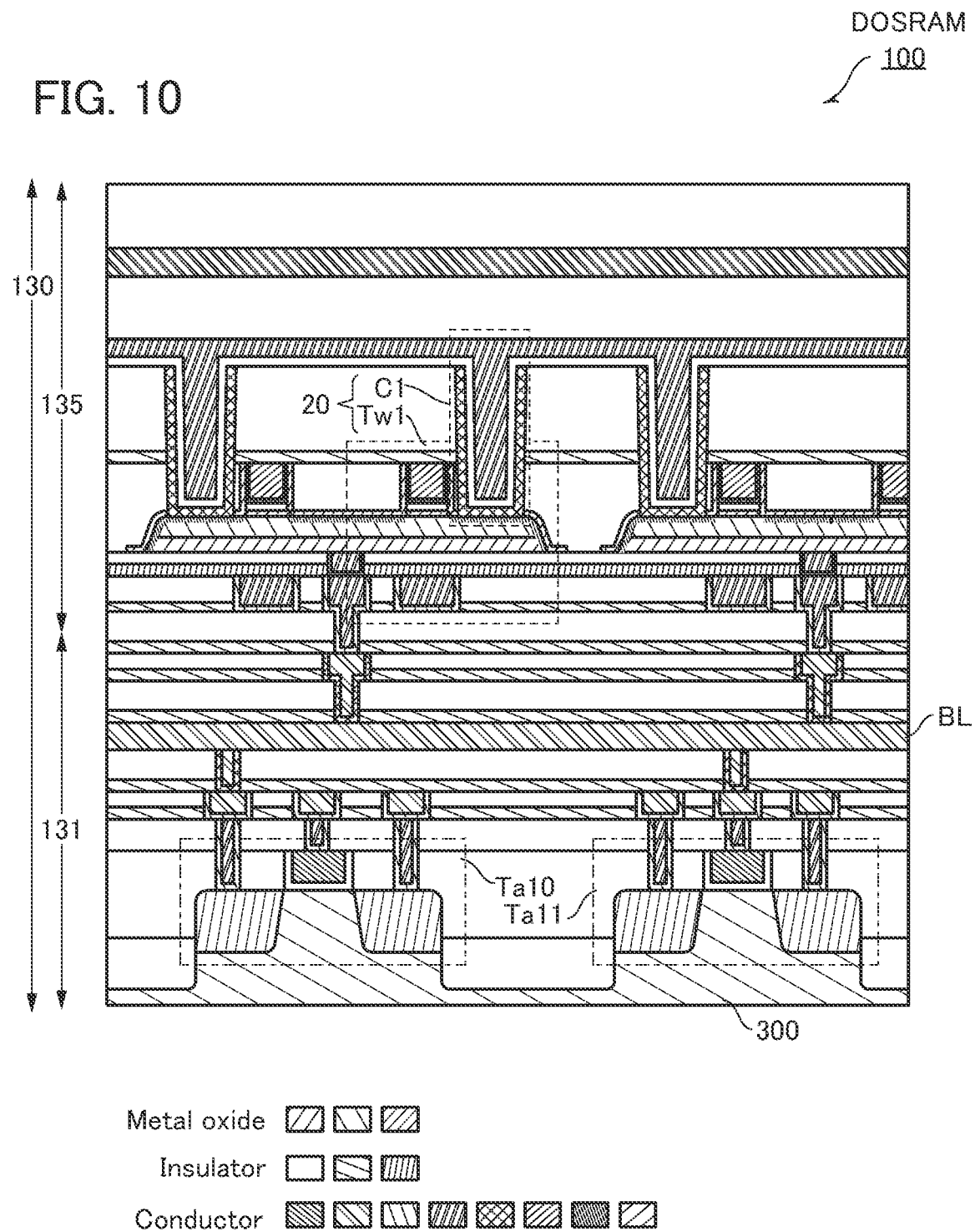

The connection structures between the semiconductor layer and the wiring illustrated in FIG. 9 and FIG. 10 can be used in a variety of semiconductor devices formed by stacking a plurality of circuits including a transistor group.

Metal oxides, insulators, conductors, and the like in FIG. 9 and FIG. 10 may each be a single layer or a stack of layers. They can be formed by a variety of deposition methods such as a sputtering method, a molecular beam epitaxy method (MBE method), a pulsed laser ablation method (PLA method), a CVD method, and an atomic layer deposition method (ALD method). Note that examples of a CVD method include a plasma CVD method, a thermal CVD method, and a metal organic CVD method.

In the example illustrated here, the semiconductor layer of the transistor Tw1 is formed using three metal oxide layers. These metal oxide layers are formed preferably with the above-mentioned metal oxides, and more preferably with a metal oxide containing In, Ga, and Zn.

Note that when an element that can form an oxygen vacancy or an element that can be bonded to an oxygen vacancy is added to a metal oxide, the carrier density is increased and the resistance is reduced in some cases. For example, when a semiconductor layer with a metal oxide is selectively reduced in resistance, a source region and a drain region can be provided in the semiconductor layer.

Typical examples of an element that reduces the resistance of a metal oxide include boron and phosphorus. Moreover, hydrogen, carbon, nitrogen, fluorine, sulfur, chlorine, titanium, a rare gas, or the like may be used. Typical examples of the rare gas element include helium, neon, argon, krypton, and xenon.

For example, when a dummy gate is used, the resistance of the semiconductor layer can be selectively reduced. Specifically, the dummy gate is provided over the semiconductor layer with an insulating layer therebetween, and the above-described element is added to the semiconductor layer using the dummy gate as a mask. Thus, the element is added to a region of the semiconductor layer that does not overlap with the dummy gate, so that the resistance of the region is reduced. As methods for adding a dopant, an ion implantation method in which an ionized source gas is subjected to mass separation and then added, an ion doping method in which an ionized source gas is added without mass separation, a plasma immersion ion implantation method, and the like can be given.

Examples of conductive materials used for the conductors include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; a metal nitride containing the above metal as its component (tantalum nitride, titanium nitride, molybdenum nitride, or tungsten nitride); and the like. Moreover, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

Examples of insulating materials used for the insulators include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. In this specification and the like, an oxynitride refers to a compound whose oxygen content is higher than nitrogen content, and a nitride oxide refers to a compound whose nitrogen content is higher than oxygen content.

REFERENCE NUMERALS 20, 22: memory cell, 31: equalizer, 32: sense amplifier, 33: selector, 100: DOSRAM, 102: control circuit, 104: row circuit, 105: column circuit, 111: decoder, 112: word line driver, 113: column selector, 114: sense amplifier driver, 115: global sense amplifier block, 116: input/output circuit, 120: memory cell and sense amplifier (MC and SA) array, 121: sense amplifier array, 125: memory cell array, 130: block, 131: sense amplifier block, 132: sense amplifier, 135: local cell array, 135a, 135b, 135c: cell array, 140: global sense amplifier, 142, 143: circuit, 600: AP (application processor) chip, 614: memory device, 615: bus, 616: interface unit, 621: memory control unit, 622: audio processing unit, 623: video processing unit, 624: display control unit, 630: memory chip, 640: processor chip, 7100: robot, 7120: flying object, 7140: cleaning robot, 7160: automobile, 7200: TV device, 7200: device, 7210: smartphone, 7220, 7230: PC, 7232: keyboard, 7233: monitor device, 7240: game console, 7260: game console, 7262: controller

The invention claimed is:

1. A memory device comprising:
a bit line;
a sense amplifier electrically connected to the bit line;
a first memory cell array including first memory cells each including a first write transistor and a first capacitor over the sense amplifier;
a second memory cell array including second memory cells each including a second write transistor and a second capacitor over the first memory cell array; and
a third memory cell array including third memory cells each including a third write transistor and a third capacitor over the second memory cell array,
wherein the bit line extends in the second memory cell array in a horizontal direction, and
wherein the bit line does not extend in the first memory cell array or in the third memory cell array in the horizontal direction.

2. The memory device according to claim 1, wherein a semiconductor layer of each of the first write transistor, the second write transistor and the third write transistor includes a metal oxide.

3. An electronic device comprising the memory device according to claim 1.

4. A memory device comprising:
a bit line;
a sense amplifier including a selector and an equalizer electrically connected to the bit line;
a first memory cell array including first memory cells each including a first write transistor and a first capacitor over the sense amplifier;
a second memory cell array including second memory cells each including a second write transistor and a second capacitor over the first memory cell array; and
a third memory cell array including third memory cells each including a third write transistor and a third capacitor over the second memory cell array,
wherein the bit line extends in the second memory cell array in a horizontal direction, and
wherein the bit line does not extend in the first memory cell array or in the third memory cell array in the horizontal direction.

5. The memory device according to claim 4, wherein a semiconductor layer of each of the first write transistor, the second write transistor and the third write transistor includes a metal oxide.

6. An electronic device comprising the memory device according to claim 4.

* * * * *